(12) United States Patent
Holland et al.

(10) Patent No.: US 7,672,355 B1
(45) Date of Patent: Mar. 2, 2010

(54) METAL VAPOR VACUUM ARC ION SOURCE

(75) Inventors: Glenn E Holland, Rockville, MD (US); Craig N Boyer, Bowie, MD (US); John F Seely, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 918 days.

(21) Appl. No.: 11/426,801

(22) Filed: Jun. 27, 2006

(51) Int. Cl.
*F27B 14/04* (2006.01)
*H05B 31/26* (2006.01)

(52) U.S. Cl. .................................. 373/77; 315/111.81

(58) Field of Classification Search .................. 373/77, 373/111, 166, 79, 68, 82; 315/111.91, 111.81; 218/134, 135
See application file for complete search history.

(56) References Cited

U.S. PATENT DOCUMENTS

| | | | |
|---|---|---|---|
| 4,714,860 A * | 12/1987 | Brown et al. | 315/111.81 |
| 4,785,220 A * | 11/1988 | Brown et al. | 315/111.81 |
| 4,952,843 A * | 8/1990 | Brown et al. | 315/111.81 |
| 5,013,578 A | 5/1991 | Brown et al. | |
| 5,841,236 A | 11/1998 | Brown et al. | |

OTHER PUBLICATIONS

Hollinger et al, "Development of a Vacuum Arc Ion Source for Injection of High Current Uranium Ion Beam into the UNILAC at GSI", Review of Scientific Instruments, vol. 75, No. 5, pp. 1595-1597, May 2004.

Batalin et al, "Further Development of the E-MEVVA Ion Source", Review of Scientic Instruments, vol. 73, No. 2, pp. 702-705, Feb. 2002.

Brown, "The Metal Vapor Vacuum ARC (MEVVA) High Current Ion Source", vol. NS-32, No. 5, pp. 1723-1727, Oct. 1985.

Serpa et al, "Anomalous Z Dependence of a Magnetic Dipole Transition in the Ti I Isoelectronic Sequence", Physical Review, vol. 53, No. 4, pp. 2220-2224, Apr. 1996.

Huck et al, "A New Ion Source for the Isol System of the Tandar Accelerator", Nuclear Instruments and Methods in Physics Research, A283, pp. 1-4, 1989.

Yushkov, "Mevva Ion Source Operated in Purely Gaseous Mode", Review of Scientic Instruments, vol. 75, No. 5, pp. 1582-1584, May 2004.

Johnson et al, "REsults From ZMEVVA: A New Source for Heavey-Ion Accelerators", Brookhaven National Laboratory, Upton, NY, pp. 2678-2680, 1998.

Brown et al, "Multi-Ampere Metal Ion Source", Lawrence Berkeley Laboratory, pp. 289-291, 1989.

Brown et al, "Status of the MEVVA High Current Metal Ion Source", Lawrence Berkeley Laboratory, pp. 343-345, 1987.

\* cited by examiner

*Primary Examiner*—Quang T Van
*Assistant Examiner*—Hung Nguyen
(74) *Attorney, Agent, or Firm*—John J. Karasek; L. George Legg

(57) ABSTRACT

A two-wire metal vapor vacuum arc (MeVVA) vacuum head includes an upper housing and a lower vacuum housing. The lower vacuum housing includes a plurality of ports, a vacuum space, and a first grid positioned in the vacuum space. A plurality of electrodes are positioned in the ports with a first end with an electrical contact area extending into the upper housing, and a second end extending into the vacuum space with an exposed electrical discharge area spaced from the first grid. An electrode of opposite polarity is positioned in one of the lower housing ports with a first end extending into the upper housing and a second end attached to the first grid. An extractor grid is positioned adjacent to the first grid, an electrode selector is operatively connected to the plurality of electrodes, and a trigger generator circuit is connected to an input of the electrode selector.

6 Claims, 7 Drawing Sheets

Fiber Optic Controlled Trigger Generator

Figures 6 A-C

METAL VAPOR VACUUM ARC ION SOURCE

FIELD OF THE INVENTION

This invention relates to a device for producing ions. More particularly, the invention relates to a device for generating a beam of metal ions.

BACKGROUND OF THE INVENTION

For many years, metal vapor vacuum arc (MeVVA) ion source systems have been used to produce beams of metal ions for injection into Electron Beam Ion Trap (EBIT), particle accelerators, and for ion implantation applications. Such systems are useful for implanting ions into surfaces of objects, or for applying metallic coatings to large substrate areas, such as the application of titanium nitride protective coatings to cutting tools, to name but a few.

Past MeVVA designs utilize a three wire system construction requiring a cathode, an anode, and a trigger wire as separate components and all in close proximity in a vacuum arc head. Some of these systems employ a low voltage (~12 mf) capacitor chargeable to 200-500 VDC that is hard-wired to both the anode and cathode.

Triggering the discharge on the three wire systems is accomplished via the third wire, which supplied a low current pulse of high voltage (10-30 kV), placed in vacuum near the anode and cathode of the MeVVA ion source head. Limitations of this type of design are a large arc jitter, on the order of about 3-6 ms, and a relatively short operation life, where the number of shots before a rebuild is necessitated is relatively small, ~100,000 shots. A failure mode occurs when the cathode sample material sputters sufficiently to coat the insulator of the trigger pin, causing an electrical short that renders the system to a non-triggerable state. Three wire, water cooled, multi-element (selected by moving parts within the vacuum enclosure) MeVVA systems have been previously built by other workers.

There is, therefore a need for a MeVVA ion source system having greater reliability, longer lifetime, and with less jitter on the ion source production.

SUMMARY OF THE INVENTION

According to the invention, a two-wire metal vapor vacuum arc (MeVVA) vacuum head includes an upper housing having a plurality of ports for receiving electrical conducting elements; a lower vacuum housing attached to the upper housing, the lower vacuum housing including a plurality of ports, a vacuum space, and a first grid positioned in the vacuum space; a plurality of electrodes each positioned in one of the plurality of lower housing ports, each electrode having a first end, extending into the upper housing and having an electrical contact area thereon for selectively making and breaking electrical connection with a first electrical conducting element, and a second end extending into the vacuum space and having an exposed electrical discharge area spaced from the first grid; an opposite polarity electrode positioned in one of the plurality of lower housing ports having a first end, extending into the upper housing and electrically connected to a second electrical conducting element, and a second end attached to the first grid; an extractor grid positioned adjacent to the first grid; an electrode selector having a plurality of outputs each connected to one of the electrical contact areas of the plurality of electrodes and a common input connected to the first electrical conducting element; and a trigger generator circuit connected to an input of the electrode selector.

The two-wire MeVVA includes multiple cathodes which can be individually selected from the control panel without internal vacuum motion. The benefits of the two wire system are a compact multi-element MeVVA vacuum head having no moving parts in vacuum and no gas or fluid cooling. The MeVVA lifetime is greater than prior art designs, exhibiting several orders of magnitude increases of shots per cathode sample. These advantages are realized by virtue of the energy needed to form the arc being provided by just a single, high voltage capacitor. The capacitor is isolated from the cathode wire via a pressurized high voltage spark gap switch to permit the sample cathode wire to also function as the trigger wire inside the MeVVA vacuum head, thereby minimizing jitter (<200 ns) on discharge of the arc. After the arc is produced inside the MeVVA head, the voltage drops to a few tens of volts across the cathode-anode gap. The ions are thereby extracted from the meniscus of the arc plasma at the desired potential for ion beam production for uses such as injection into the EBIT.

Additional features and advantages of the present invention will be set forth in, or be apparent from, the detailed description of preferred embodiments which follows.

DETAILED DESCRIPTION OF THE PREFERRED EMBODIMENTS

DEFINITIONS: As used herein, the terms "anode" and "cathode" can be interchanged depending on the specific application and whether an ion source is to be a negative or positive ion source, respectively. The terms "electrode" and "opposite polarity electrode" as used below are intended to embody this concept.

Figure 1:
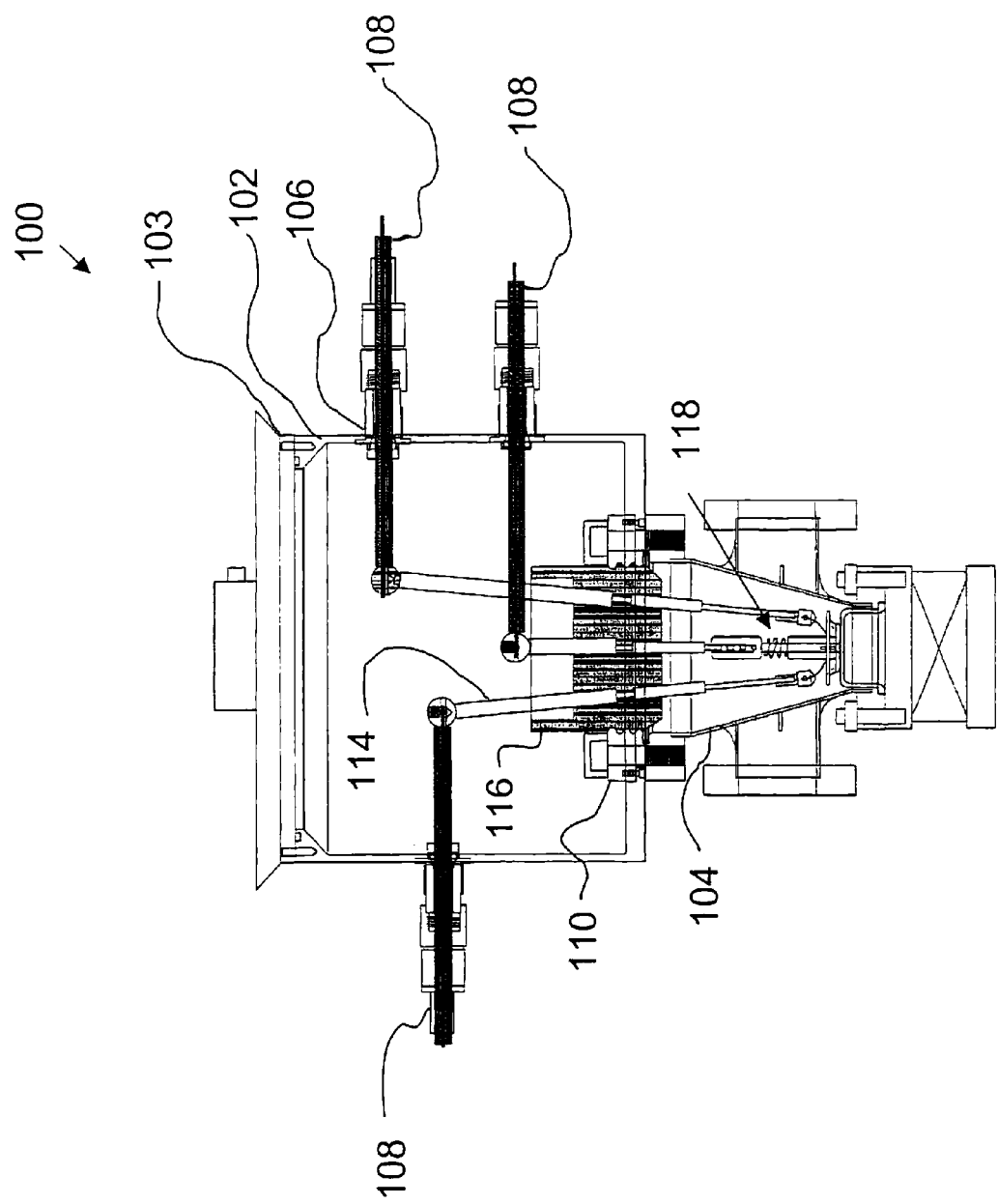
FIG. 1 is a schematic cross-sectional diagram of an MeVVA according to the invention.
Figure 2:
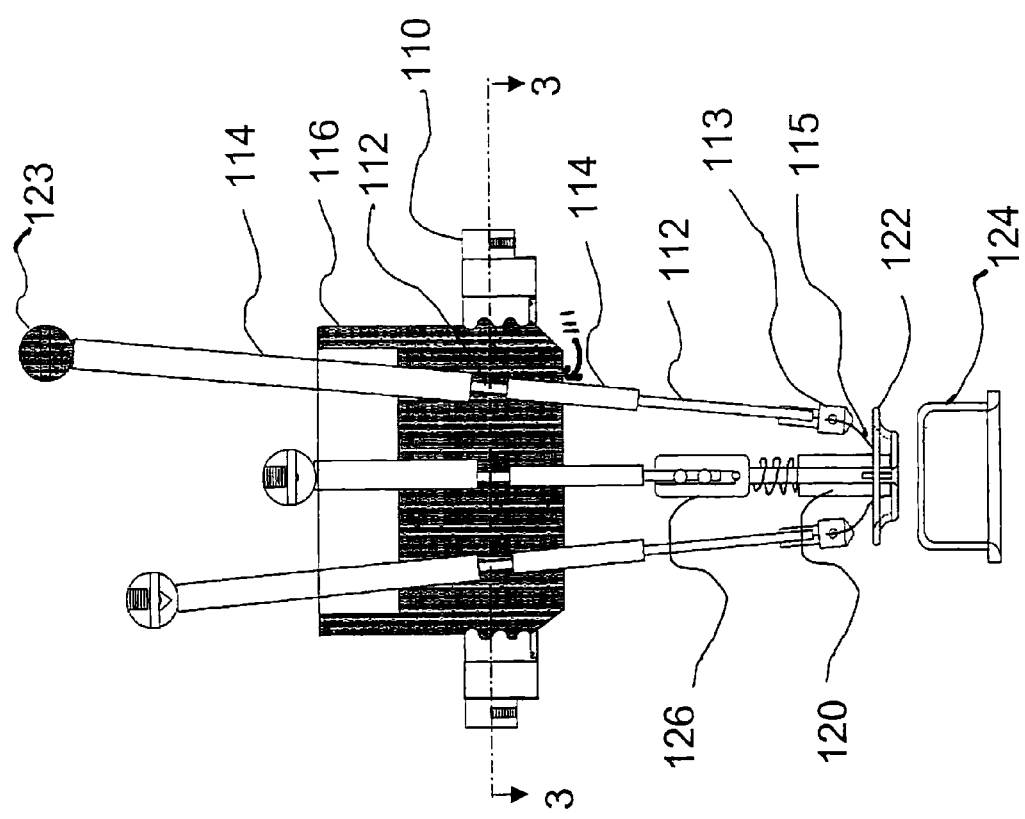
FIG. 2 is a schematic cross-sectional diagram of an MeVVA as in FIG. 1 showing further detail according to the invention.
Figure 3:
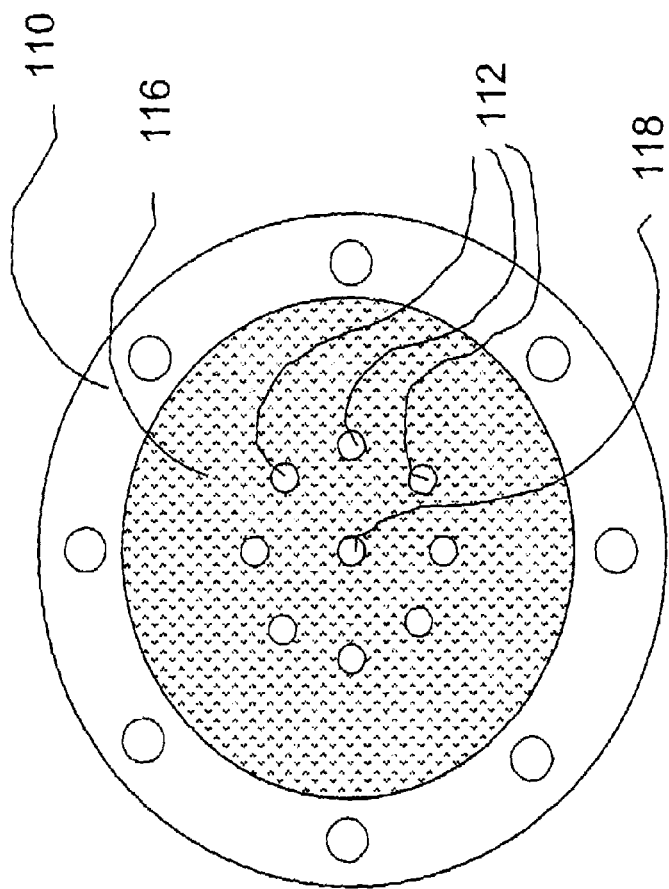
FIG. 3 is a schematic cross-sectional diagram of an MeVVA taken through section 3 of FIG. 2 according to the invention.

Referring now to FIGS. 1-3, a metal vapor vacuum arc (MeVVA) ion source head assembly 100 includes an upper housing 102 that is preferably a Radio Frequency (RF) tight enclosure, and a lower vacuum housing 104. Upper housing 102 includes a plurality of openings 106 for receiving electrical conductors 108, for example high voltage RG-8 coaxial cable as the electrical conducting element. Lower vacuum housing 104 is secured to upper housing 102 by means of a high voltage vacuum feedthrough flange 110. e.g. a modified 4.5" Conflat flange, for holding a plurality of cathodes 112 in sleeve 113 within support insulators 114 secured in lower housing ports 111. e.g. alumina tubes potted with a low outgassing epoxy 116 preferably rated at 600 V per 0.025 mm. The conductors/electrodes are preferably arranged so that an opposite polarity electrode, common anode 118, is positioned along a center axis with the individually selectable cathodes 112 positioned concentrically around the center axis and spaced equally apart. Anode 118, which is secured within an insulator 120, e.g. a quartz material, includes an anode grid 122 spaced apart from an extractor grid 124.

Cathodes 112 are sample wires that may be pure or alloy conductive metals preferably 1 mm to 2 mm in diameter with one end extending into the upper housing 102 and terminating in an electrical contact area 123. e.g. a spherical contact ball for selectively making or breaking contact with an electrode selector (cathode element selector switch 208 and associated electrical conducting elements as is discussed further below). The gap between the anode 118 and the opposite end, cathode sample wire tip 115 of each cathode 112 (i.e. the end positioned in the lower vacuum housing 104), is preferably in the range of 0.5 mm to 4.0 mm. Anode insulator 120, preferably held in good physical contact with the cathode 112 sample material and the anode grid 122, in one embodiment is fabricated from fused silica rod to allow a sliding spark discharge between the cathode 112 and anode 118 and to also act as a shield to mitigate cross contamination of the cathode samples. A support rod 126 affixes the anode grid 122 to a center anode conductor. Support rod 126 is preferably adjustable in order to set the anode-cathode gap to a selected value as desired for a particular application. A representative outside diameter of the anode grid 122 is 31.75 mm and is preferably dished in the center to form a "cup" where the cathodes 112 sample wires are positioned. The anode cup is perforated, e.g. with 72 holes each 1 mm in diameter arranged in concentric patterns with the smallest being a 6.35 mm diameter circle having 8 holes. This design allows for the entire anode-cathode assembly to be aligned and supported by a single compact flange and for the cathode wires to be field graded by the anode grid 122. The opposing surfaces of the anode grid 122 and extractor grid 124 preferably are polished to a mirror finish. The extractor grid 124 preferably has the same hole size and pattern as the anode grid 122 and is positioned with the holes co-aligned during operation. The extractor grid 124, anode support rod 126, and anode grid 122 are preferably fabricated from 303 stainless steel.

Figure 4:
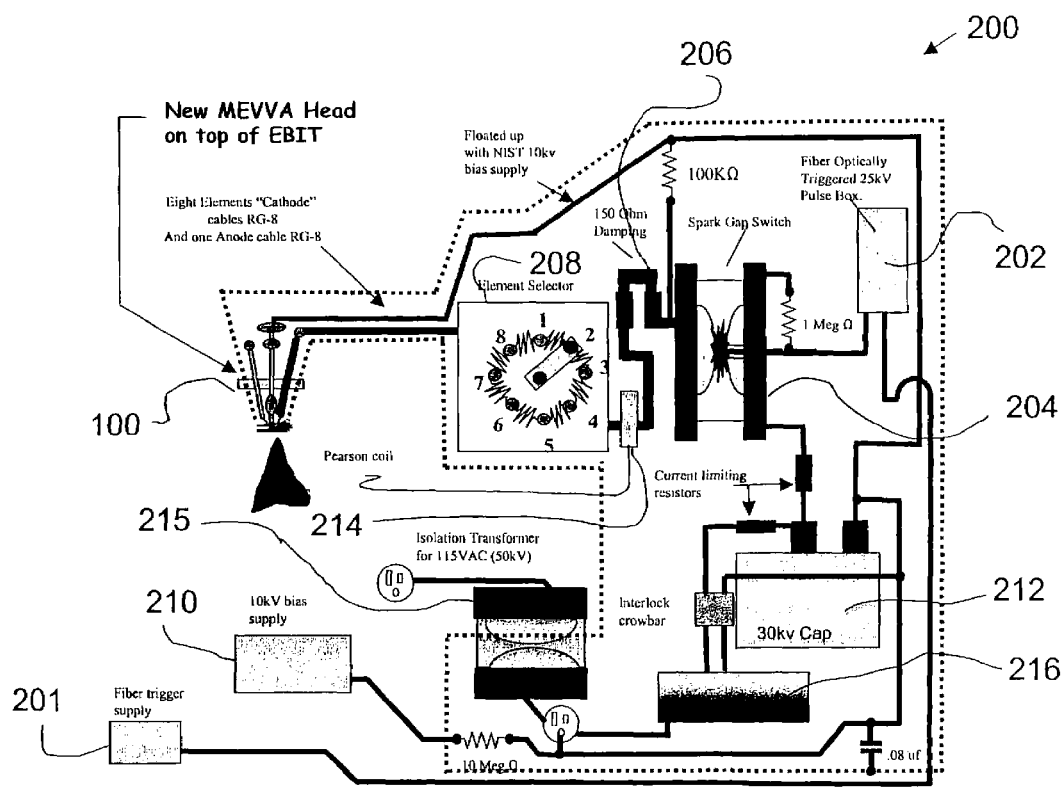
FIG. 4 is a schematic diagram circuit for the MeVVA according to the invention.
Figure 5:
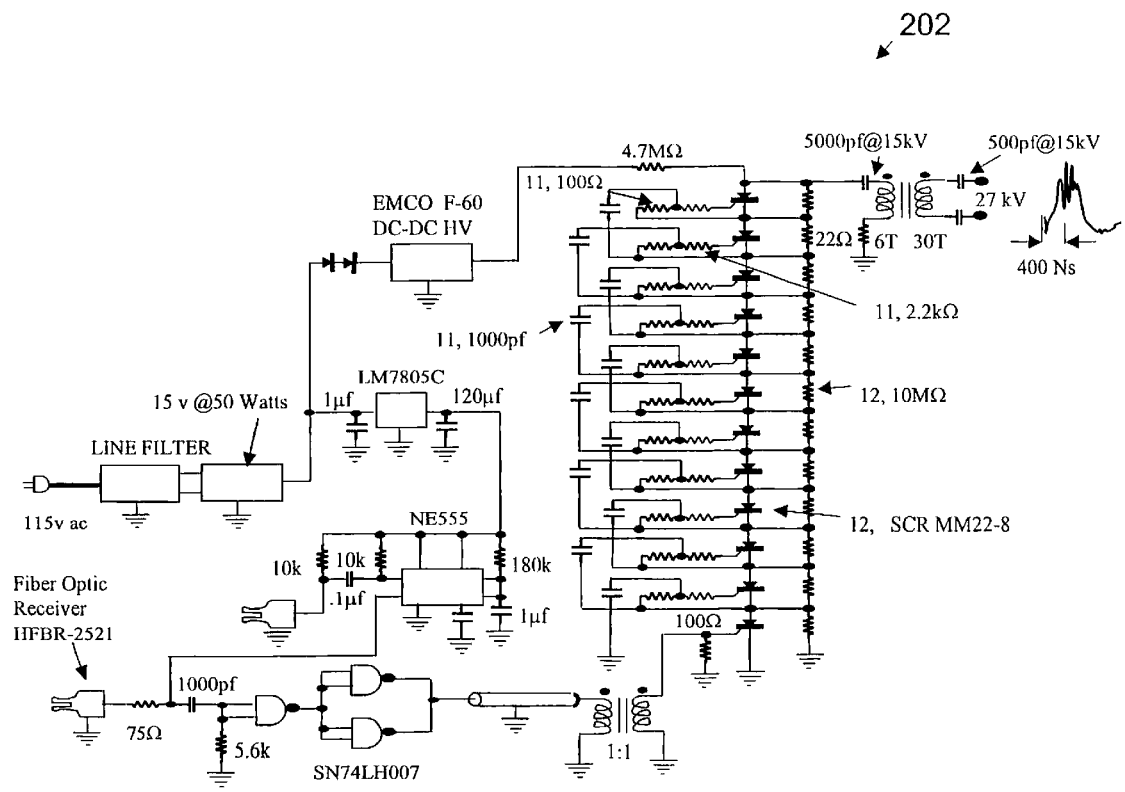
FIG. 5 is a schematic diagram of a trigger generator circuit for an MeVVA according to the invention.

Referring also now to FIG. 4, illustrating a trigger circuit 200 for MeVVA 100, the sequence for ion production is as follows: an optical pulse is output by a fiber trigger supply 201 and received by a trigger generator 202, shown in greater detail in the circuit diagram in FIG. 5, which then triggers a pressurized spark gap switch 204. This switch rapidly conducts the charge through a damping resistor 206, through the cathode element selector switch 208, then through a length. e.g. 10 meters, of RG-8 coaxial cable used as a high voltage cable that arrives at the radio frequency (RF) tight enclosure of the MeVVA upper housing 102 and the high voltage pulse appears across cathode sample wire tip 115 and anode grid 122 due to insulator 120. Switch 208 provides the capability to individually select any one of the plurality of cathodes 112 from a control panel outside of assembly 100 without breaking vacuum, thereby providing a two-wire MeVVA with a first wire connecting the trigger circuit 200 to the anode and the second wire coupling circuit 200 via switch 208 with a selected cathode. The invention thereby eliminates the need for a separate (third) trigger wire with the attendant disadvantages noted above. A high voltage power supply 216 powered by AC mains via an isolation transformer 215, charges a single high voltage capacitor 212 isolated from the cathode wire via a spark gap switch 204, providing the sample cathode wire with the capability to also function as the trigger wire inside the MeVVA vacuum head, thereby minimizing jitter (<200 ns) on discharge of the vacuum arc. This type of spark gap switch is well known in the art and can operate at discharge rates of 10's of Hz if desired. One draw back with the Spark Gap switches is life time of $4-5 \times 10^{+6}$ shots and to achieve the lower trigger jitter they must be stressed with high voltage thus limiting the useful operation range of the system (22-30 kv). Solid state high voltage-high current switches are now available such as thyristors which have very low jitter, don't need the high voltage stress and have life times of $1 \times 10^{+10}$ shots. Trigger generator circuit 200 as shown delivers a 27 kV pulse with 400 ns duration to the spark gap switch 204. The spark gap switch 204 triggers within a few tens of ns after receiving the pulse and rapidly conducts the energy from the high voltage capacitor 212. The energy pulse is over damped with six 1 kW, 100 ohm wire-wound resistors which form a series resistor of 150 ohm. This allows 2.4 mC of charge to be delivered to the cathode sample in the MeVVA head.

Figure 6:
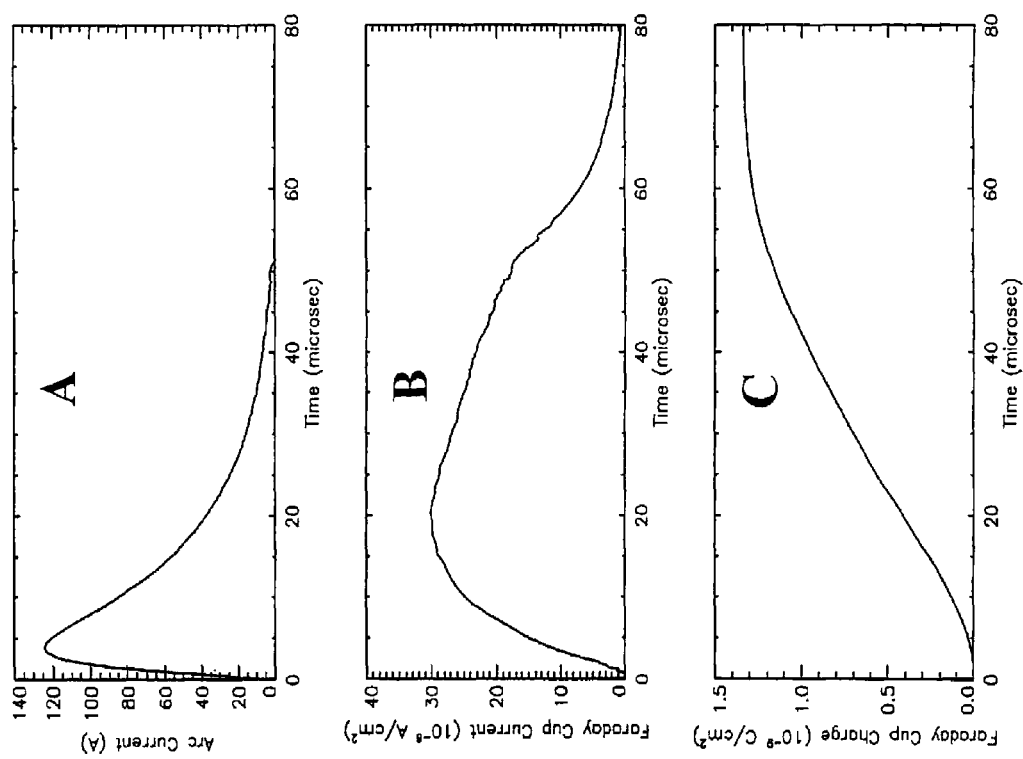
FIG. 6A is a graph showing the discharge current, FIG. 6B the Faraday cup current, and FIG. 6C the Faraday cup charge, in an MeVVA according to the invention.

Pearson coil 214 is included to monitor the discharge current, typically on the order of about 125 A, which in the tested apparatus (described further below) decayed exponentially over a period of 50 μs as shown in FIG. 6A. All the cathodes were biased simultaneously via a ladder of 10 megohm resistors connected to the output of the rotary switch system. Nine separate RG-8 coaxial cables are used to carry the energy pulse from the electronics enclosure directly to the MeVVA head. The outside braid of the coaxial cable is sufficient for good RF shielding, and the internal polyethylene insulation for the center conductor functions well below 50 kV. One coaxial cable is the common anode and the other eight connect to the different cathode sample materials. The rotary selector switch is manually actuated from the outside of the control electronics via a knob which is connected to the switch by means of a high voltage insulated rod.

After the arc is produced inside the MeVVA head, the voltage drops to a few tens of volts across the cathode-anode gap. The ions are thereby extracted from the meniscus of the arc plasma at the desired potential for injection into the EBIT. When the high voltage pulse reaches the tip 115 of the cathode sample material in vacuum, it jumps a small gap to the anode grid 122 which allows the arc discharge to occur. Both the cathode and anode grids are floated by a bias supply 210 up to an applied bias voltage relative to the extractor grid which remains at chamber ground.

Figure 7:
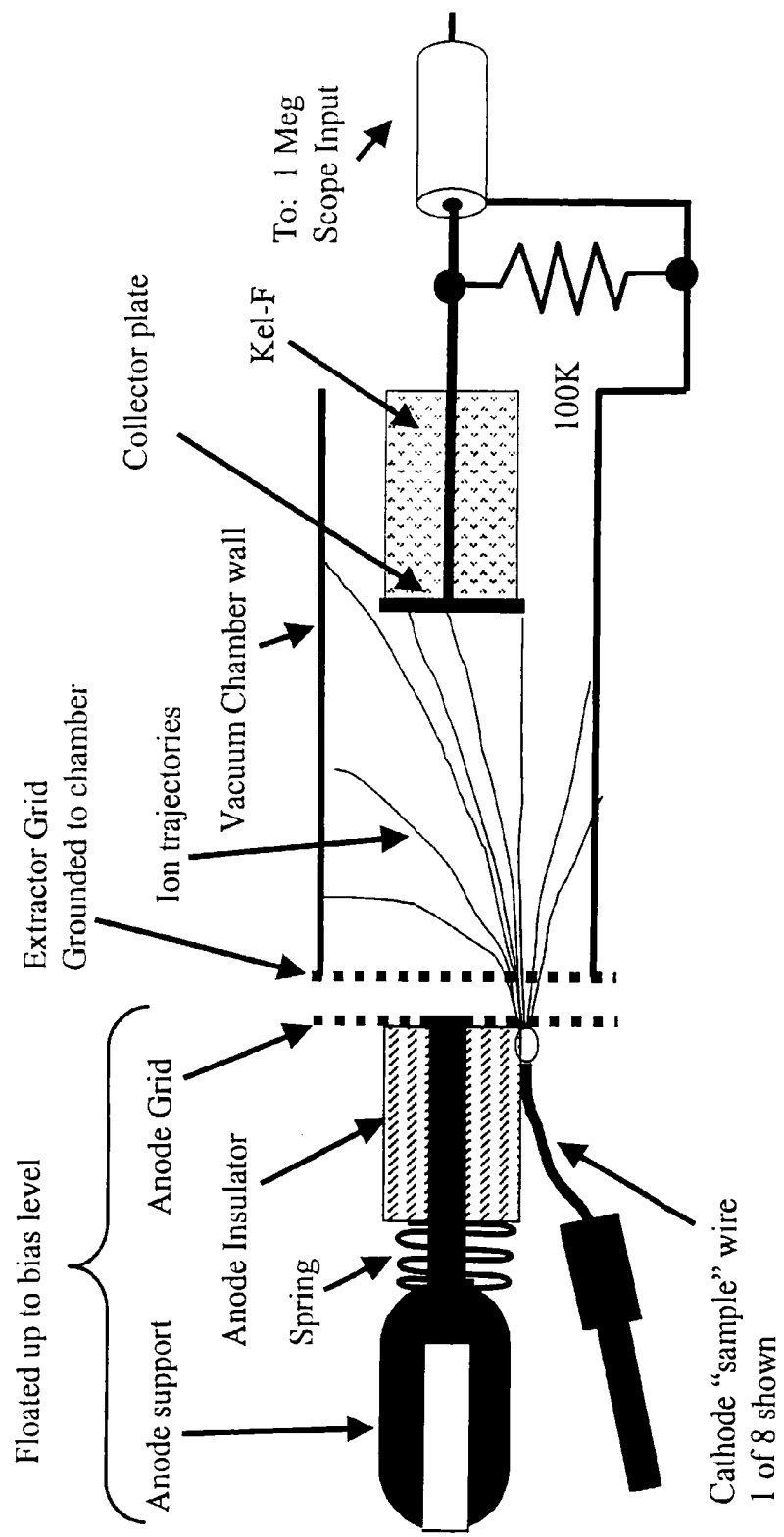
FIG. 7 is a schematic diagram of an MeVVA ion head according to the invention.

Referring now to FIG. 7, a bench test setup of MeVVA 100 was fabricated to allow vacuum tests and ion production measurements to be performed. The system was constructed from standard Conflat vacuum hardware and contained an unbiased Faraday cup which could be moved via a linear feedthrough to vary the distance from the MeVVA arc plasma. The arc discharge could also be observed through viewing ports using a mirror. The system was pumped to $1 \times 10^{-7}$ Torr during the bench testing phase. After the extractor and anode grid were degassed and conditioned, the shot-to-shot variation in discharge current was typically <2%. The bias supplied to the control electronics was +12 kV for the bench testing. Shown in FIGS. 6A-C are the oscilloscope traces obtained during the bench tests of the MeVVA system. On average, a single discharge from an iron cathode produced an ion flux of $8.4 \times 10^9$ ions/cm$^2$ detected by the unbiased Faraday cup which was 1.9 cm in diameter and positioned 20 cm from the extractor grid. This flux was stable for the first 500,000 shots, and the signal was recorded by an oscilloscope running a five shot average and assumes singly charged ion species. The number of ions detected decreases after 700,000 shots to $4.2 \times 10^9$ ions/cm$^2$ collected per pulse. This decrease is thought to be caused by the sample material coating the quartz insulator which effectively moves the anode closer to the cathode sample wire, thus further from the extractor grid, which limits ion extraction. It should be noted that at no time was the sample material shorted or rendered to a non-triggerable state during the bench testing. The metals which are ductile and readily sputter are presumed to have shorter lifetimes, but tests conducted on a pure tin sample produced 35,000 shots without failure. During laboratory testing, the arc jitter was low (<200 ns), and lifetimes of the cathode sample were demonstrated at $7\times10^5$ shots or more with the system mounted horizontally as shown. Ions are extracted from the arc plasma and accelerated toward the EBIT system or other desired target with a kinetic energy established by the bias voltage. We found that electrons were stopped at the extractor grid and that the extracted ions could be efficiently transported along an axial magnetic field downstream of the arc plasma.

Obviously many modifications and variations of the present invention are possible in the light of the above teachings. It is therefore to be understood that the scope of the invention should be determined by referring to the following appended claims.

We claim:

1. A metal vapor vacuum arc (MeVVA) apparatus, comprising: a vacuum head including:
    an upper housing including a plurality of ports for receiving electrical conducting elements;
    a lower vacuum housing attached to said upper housing, said lower vacuum housing including a plurality of ports, a vacuum space, and a first grid positioned in said vacuum space;
    a plurality of electrodes each positioned in one of said plurality of lower housing ports, each said electrode having a first end, extending into said upper housing and having an electrical contact area thereon for selectively making and breaking electrical connection with a first electrical conducting element of such electrical conducting elements, and a second end extending into said vacuum space and having an exposed electrical discharge area spaced from said first grid;
    an opposite polarity electrode positioned in one of said plurality of lower housing ports having a first end, extending into said upper housing and electrically connected to a second electrical conducting element of such electrical conducting elements, and a second end attached to said first grid;
    an extractor grid positioned adjacent to said first grid;
    an electrode selector having a plurality of outputs each connected to one of said electrical contact areas of said plurality of electrodes and a common input connected to the first electrical conducting element; and
    a trigger generator circuit connected to an input of said electrode selector.

2. A metal vapor vacuum arc (MeVVA) apparatus as in claim 1, wherein the plurality of electrodes are cathodes and the opposite polarity electrode is an anode.

3. A metal vapor vacuum arc (MeVVA) apparatus as in claim 1, wherein said trigger generator circuit comprises:
    a power supply;
    a capacitor having an input connected to said capacitor and an output connected to said input of said electrode selector; and
    a controller connected to the power supply for controlling a vacuum arc discharge pulse rate.

4. A metal vapor vacuum arc (MeVVA) apparatus as in claim 3 wherein the plurality of electrodes are cathodes and the opposite polarity electrode is an anode centrally positioned relative to said cathodes.

5. A metal vapor vacuum arc (MeVVA) apparatus as in claim 1, wherein the plurality of electrodes are cathodes each comprising a material different than any other said cathode of the plurality of cathodes.

6. A metal vapor vacuum arc (MeVVA) apparatus as in claim 1, wherein the plurality of electrodes are cathodes and the opposite polarity electrode is an anode adjustably mounted to permit selective adjustment of an anode-cathode gap.

* * * * *